United States Patent [19]
Caldwell

[11] Patent Number: 5,640,053
[45] Date of Patent: Jun. 17, 1997

[54] INVERSE OPEN FRAME ALIGNMENT MARK AND METHOD OF FABRICATION

[75] Inventor: Roger F. Caldwell, Milpitas, Calif.

[73] Assignee: Cypress Semiconductor Corp., San Jose, Calif.

[21] Appl. No.: 354,631

[22] Filed: Dec. 13, 1994

Related U.S. Application Data

[62] Division of Ser. No. 269,850, Jul. 1, 1994, Pat. No. 5,401,691.

[51] Int. Cl.$^6$ .................... H01L 23/58; H01L 23/544; H01L 23/48
[52] U.S. Cl. .................... 257/797; 257/641; 257/650; 257/771
[58] Field of Search .................... 257/797, 211, 257/770, 771, 774, 641, 650; 437/924, 984, 229; 148/DIG. 102; 430/22, 5; 324/758, 769

[56] References Cited

U.S. PATENT DOCUMENTS

| | | | |
|---|---|---|---|
| 4,125,418 | 11/1978 | Vinton | 156/626 X |
| 4,632,724 | 12/1986 | Chesebro et al. | 156/626 |
| 4,837,181 | 6/1989 | Galbiati et al. | 437/45 |
| 5,016,069 | 5/1991 | Bergemont | 257/316 |
| 5,216,280 | 6/1993 | Tanaka et al. | 257/734 |
| 5,298,110 | 3/1994 | Schoenborn et al. | 156/645 X |
| 5,332,470 | 7/1994 | Crotti | 156/659.1 |
| 5,354,632 | 10/1994 | Dao | 430/5 |

*Primary Examiner*—Mahshid D. Saadat
*Assistant Examiner*—Jhihan B. Clark
*Attorney, Agent, or Firm*—Blakely, Sokoloff, Taylor & Zafman LLP

[57] ABSTRACT

A method for forming an alignment mark during semiconductor device manufacturing. A first area and a second area are provided on the semiconductor substrate wherein the second area is adjacent to the first area. An alignment mark is formed in the first area. A first layer is formed over the first area and the second area wherein the alignment mark is replicated in the first layer. The first layer is then removed from the second area and left over the first area. A globally planarized second layer, is formed over the first area and the second area. The second layer is then removed from the first area and is left over the second area.

7 Claims, 16 Drawing Sheets

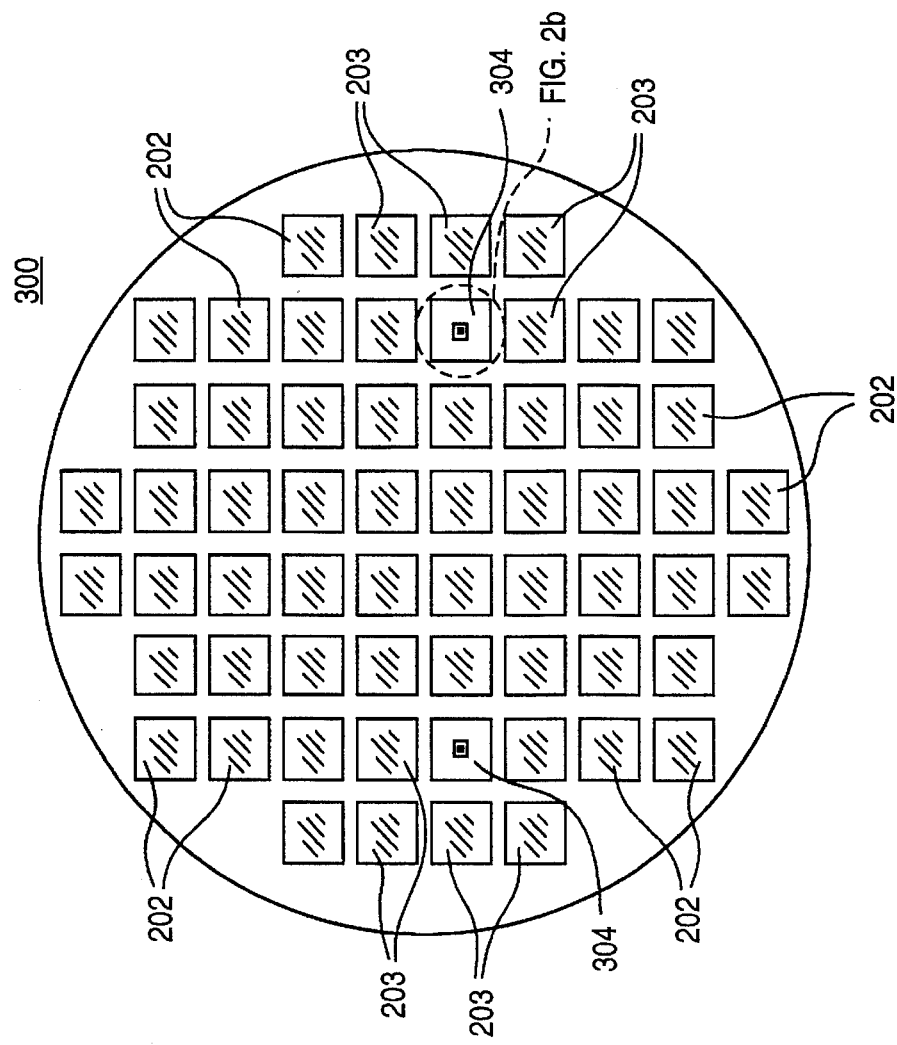
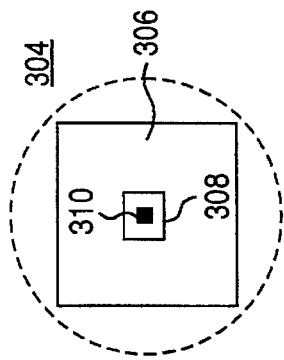
FIG. 2a
FIG. 2b

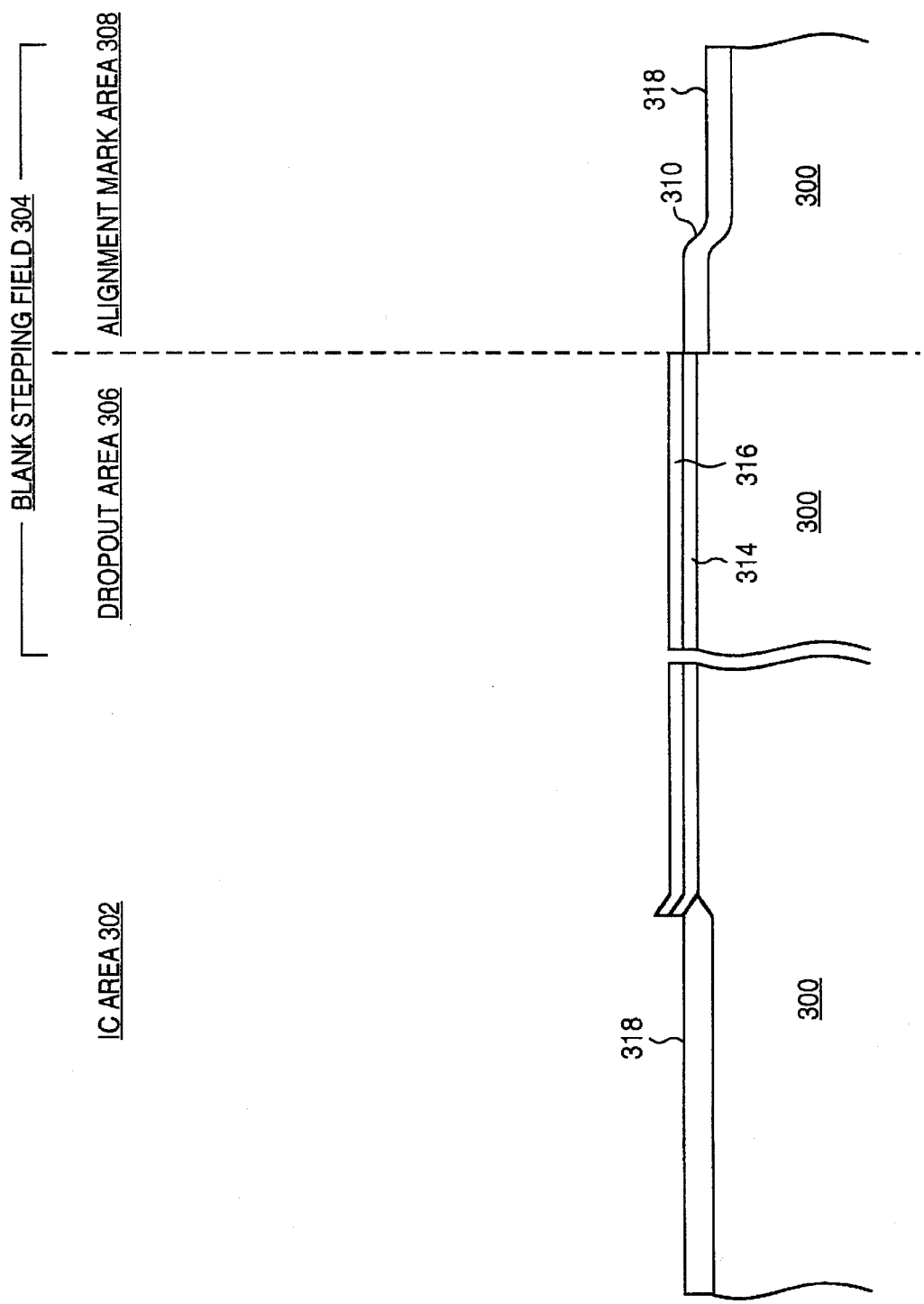

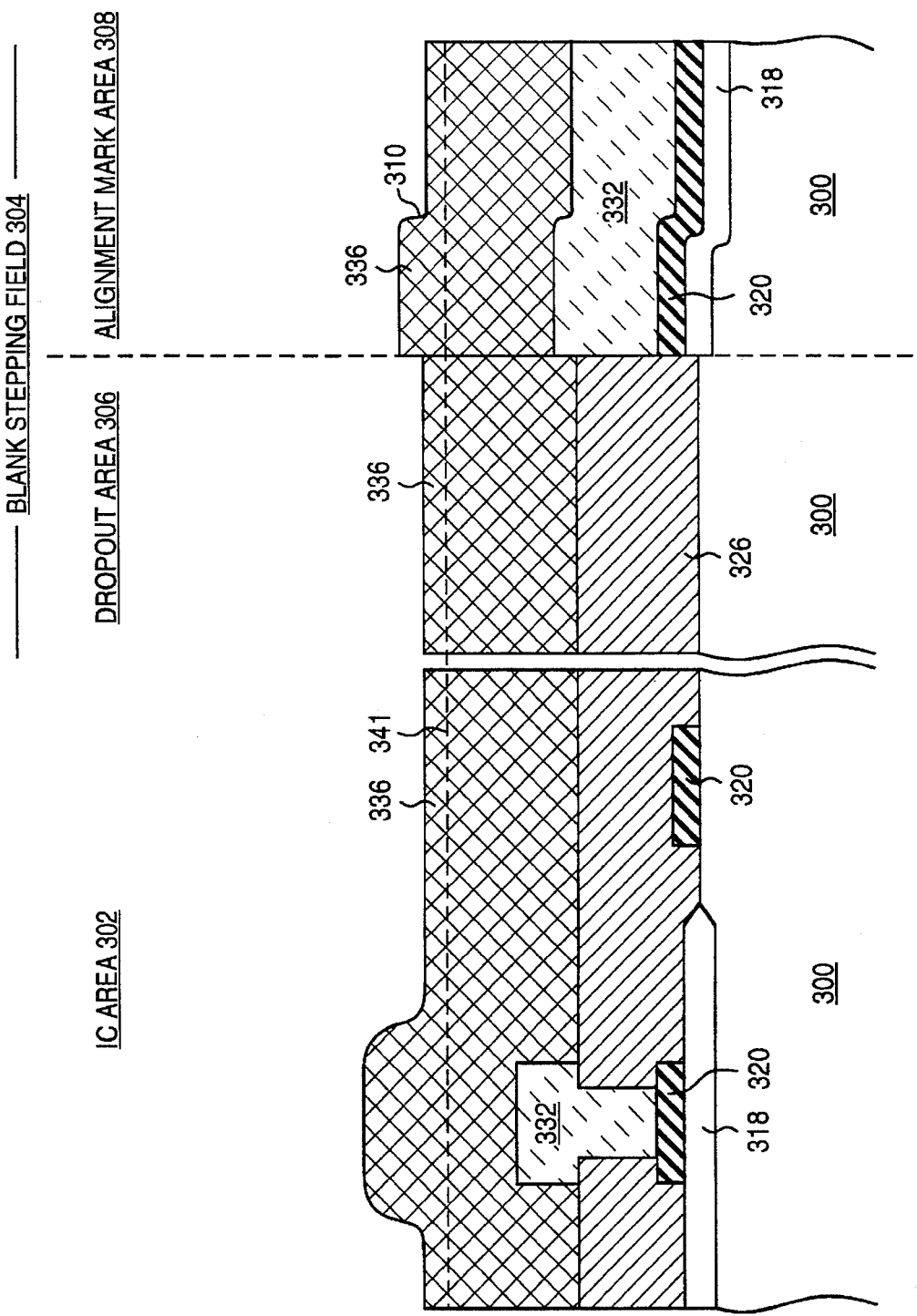

OPEN FRAME RETICLE

INVERSE OPEN FRAME RETICLE

INVERSE OPEN FRAME ALIGNMENT MARK AND METHOD OF FABRICATION

This is a divisional of application Ser. No. 08/269,850, filed Jul. 1, 1994, now U.S. Pat. No. 5,401,691.

BACKGROUND OF THE INVENTION

1. Field of the invention

The present invention relates to the field of semiconductor processing, and more specifically to methods and apparatuses utilized in the formation of alignment marks during the fabrication of semiconductor devices.

2. Description of Related Art

In semiconductor integrated circuit (IC) fabrication processes, multiple layers of conductors and insulators are patterned and built one upon the other to construct the IC. During the fabrication process it is critical to align each subsequent layer to a previous layer with great precision in order to preserve circuit continuity. The degree of alignment precision is often a major factor which determines the manufacturability, yield, and profit of a process.

The alignment of one layer to the next is typically accomplished in a tool called a *wafer stepper*. The purpose of the stepper is to transfer a desired pattern situated on a reticle into a layer formed on the semiconductor wafer. (The reticle typically contains a magnified (5×) version of the pattern to be generated.) As is well known in the art, in a typical alignment operation, a semiconductor wafer, having an alignment mark, is coated with a transparent photosensitive material (generally referred to as photoresist). The wafer is then loaded into the wafer stepper tool. The stepper uses the alignment mark on the wafer as a reference point in adjusting the position of the reticle over the wafer to precisely align the reticle to the previous layer on the wafer.

Generally, a stepper utilizes a laser beam with a fixed wavelength to sense the position of the alignment mark on the wafer. The laser beam in the stepper is bounced off of the alignment mark on the semiconductor wafer surface to create a slonal pattern of laser light. The defraction from the alignment mark is reflected back to sensing devices in the stepper and is used as a signal to measure the exact position of the alignment mark. The quality of the defractive light from the alignment mark is a direct result of the structure of the alignment mark (i.e., a result of the materials and dimensions of the mark).

General problems associated with present techniques of generating alignment marks and aligning wafers are illustrated in FIGS. 1a–1. As shown in FIG. 1a, individual integrated circuits 122 are generated in each stepping field of the stepper. Generally there are two blank stepping fields 120 which are skipped during alignment and exposure of the various reticles used to pattern the wafer. As shown in FIG. 1a–2, are small rectangular alignment mark 102 (appx. a couple hundred microns) is typically formed near the center of each blank stepping field 120. Alignment mark 102 is very small in relationship to blank stepping field 120.

An alignment mark 102 is generally formed by etching a control distance into the semiconductor wafer 100, as shown in FIG. 1b. The etching step forms a step height 104 in the wafer 100. The step height 104 acts as the alignment mark. Step height 104 of alignment mark 102 is generally chosen to be some multiple, typically ¼, of the wavelength of the laser light used by the stepper to conduct alignment. By utilizing an alignment mark which is a ¼ multiple of the laser wavelength, the signal to noise ratio of the laser defraction is optimized, resulting in optimum alignment precision.

Next, as shown as FIG. 1c, subsequent layers used to form the integrated circuit are grown and deposited over the wafer. For example, field isolation regions 106, polysilicon conductors 108, and interlayer dielectrics (ILDs) 110 are grown and deposited respectively over the semiconductor wafer. Although the original alignment mark 102 is covered by subsequent layers, the step height 104 and the therefore, the alignment mark 102, is replicated in the subsequently deposited layers. The replicated alignment marks are used for aligning and patterning the subsequent layers. That is, as more layers are added to the IC, the step height of the alignment mark is propagated upward or is "built upward" with subsequent layers. The step height of the alignment mark is therefore preserved in subsequent layers so that alignment of subsequent layer can be accomplished.

A problem with building up the alignment mark is that it is incompatible with global planarization techniques, such as chemical-mechanical polishing. As more and more layers are added to the IC process, and circuit density increases, the requirement to planarize the IC topography at intermediate steps in the process becomes essential. It is important to planarize surfaces of multilevel integrated circuits because nonplanar surfaces interfere with the optical resolution of subsequent photolithography processing steps. This makes it extremely difficult to print high resolution lines. Additionally, nonplanar surface topographies can effect subsequently formed metal layers. If a step height is too large, there is a serious danger that open circuits will be formed in later metal layers. It has been found that the best way to planarize the IC topography is to planarize the ILDs and to use a global planarization technique, such as chemical-mechanical polishing. Global planarization techniques planarize the entire wafer surface and make the surface essentially flat. Unfortunately, if ILD 110 is globally planarized, not only is the ILD 110 over the IC area 100 planarized, but so is the ILD 110 over the alignment mark. The global planarization technique, therefore, removes the alignment mark replicated in ILD 104, as shown in FIG. 1d.

Although the alignment mark has been removed during the global planarization step, the next process step, which is typically a contact etch step, can still proceed because the alignment mark 104 is visible through the transparent ILD 110. That is, the contact etch pattern step can be aligned to the step height formed in polysilicon layer 108.

The next step in the fabrication of ICs typically is the formation of metal interconnects. As shown in FIG. 1e, a metal layer 112 is blanket deposited over ILD 110 and into contact 117, so that an electrical connection can be made with the polysilicon layer 108. Because metal layers are opaque, the step height 104 of alignment mark 102 formed in polysilicon layer 108 is invisible to the stepper laser. Without a visible alignment mark or an alignment mark replicated in metal layer 112, it is impossible to align the reticle to generate the metal interconnection pattern.

Another problem associated with present techniques of forming alignment marks is a "*high mesa*" effect which can cause a non-uniform polishing of the substrate surface. Since blank stepping field 120 is skipped during alignment and exposure of substrate 100, the photoresist layers over blank stepping field 120 are never exposed during the process. Thus, all layers deposited on substrate 100 are always deposited over blank stepping field 120 but are never removed or etched away. Blank stepping field 120, therefore, consists of the worse case (highest) elevation structure on the wafer.

As a result, blank stepping field 120 appears to the polisher as a "*high mesa*" or a large flat area. Since the area is large and flat the polish rate of blank stepping field 120 is slow; like that of a blank wafer. The *high mesa* of blank stepping field 120 lowers the polish rate of the edges of the IC die 122 which immediately surround blank stepping field 120. The *high mesa* effect, therefore, can cause an unacceptable yield falloff on die which border blank stepping field 120.

One solution to the planarized alignment mark problem is an *"open frame"* process. In an open frame process, after contact alignment, a separate reticle (an open frame reticle) is used to expose the area immediately surrounding alignment mark 102. ILD 110 over alignment mark 102 can then be etched away during the contact etch. Metal layer 112 can then be formed over uncovered alignment mark 102 formed in polysilicon layer 108, as shown in FIG. 1f. Alignment mark 102 replicated in metal layer 112 can then be used to align the reticle to generate of the metal interconnect pattern.

The *"open frame"* solution works fine in processes that require only one global planarization step. Many IC processes, however, require two global planarization steps. When a second global planarization step is required, it is not feasible to repeat the open frame alignment etch, due to the increased thickness of the dielectric material over the alignment mark. That is after the second global planarization, the depth of the dielectric material over the alignment mark is increased by the depth of the original open frame etch in comparison to the relevant structures on the IC. As a result, if one were to use a second open frame etch, chances are the relevant structure on the IC could not withstand the additional etching required to open the alignment mark.

Thus, what is required is a method and apparatus for fabricating an alignment mark during multilayer semiconductor processes which are compatible with global planarization techniques, such as chemical-mechanical polishing (CMP).

SUMMARY OF THE INVENTION

A novel process for forming an alignment mark during the fabrication of a multilevel integrated circuit (IC) is described. First, an alignment mark is formed in an alignment mark area of a silicon substrate. Surrounding and directly adjacent to the alignment mark area, is a dropout area. A field oxide layer is grown, such that the oxide layer is grown over the alignment mark area and substantially replicates the alignment mark. Field oxide is not grown over the dropout area. A polysilicon layer is then deposited over the alignment mark area and the dropout area such that the alignment mark is replicated in the polysilicon layer. The polysilicon layer is then etched in such a manner as to remove polysilicon layer over the dropout area is removed and to leave the polysilicon layer over the alignment mark. A first insulating layer, such as BPSG, is deposited over the alignment mark area and the dropout area. The first insulating layer is then chemically-mechanically polished so that the alignment mark is not replicated in the planarized first insulating layer. The planarized first insulating layer is then etched in such a manner as to remove the planarized first insulating layer from the alignment mark area to reveal the alignment mark replicated in the polysilicon layer and to leave the planarized first insulating layer over the dropout area. Next, a metal layer is deposited over the alignment mark area and the dropout area such that the alignment mark is replicated in the metal layer. The metal layer is then etched to remove the metal layer from the dropout area and to leave the metal layer over the alignment mark area. Next, a second insulating layer is deposited over the alignment mark area and the dropout area. The second insulating layer is then chemically-mechanically planarized such that the alignment mark is not replicated in the planarized second insulating layer. Next, the planarized insulating layer is etched to remove the planarized second insulating layer from the alignment mark area and reveal the alignment mark replicated in the metal layer and to leave the second planarized layer over the dropout layer. Finally, a second metal layer is formed over the alignment mark area and the dropout area. The novel process of the present invention form an alignment mark topography which does not create *"high mesa"* effects during chemical-mechanical polishing. Additionally, the novel process of the present invention allows the recovery of an alignment mark from planarized layers without requiring substantial over etching or supplemental process steps.

BRIEF DESCRIPTION OF THE DRAWINGS

FIG. 2a and 2b are an illustration of an overhead view of a semiconductor substrate.

FIG. 3b is an illustration of a cross-sectional view showing the formation of a pad oxide, a silicon nitride, and a photoresist layer on the substrate of FIG. 3a.

FIG. 3c is an illustration of a cross-sectional view showing the growth of a field oxide layer on the substrate of FIG. 3b.

FIG. 3h is an illustration of a cross-sectional view showing the formation of an interlayer dielectric on the substrate of FIG. 3g.

DETAILED DESCRIPTION OF THE PRESENT INVENTION

The present invention describes novel methods and apparatuses for the formation of alignment marks during the processing of semiconductor wafers. In the following description numerous specific details are set forth, such as specific process steps, and materials, etc., in order to provide a thorough understanding of the present invention. However, it will be obvious to one skilled in the art, the present invention may be practiced without these specific details. In other instances, well-known semiconductor process stops, such as ion implantation and spacer formation, are not described in detail in order to not unnecessarily obscure the present invention.

The present invention describes a method and apparatus for the formation of an alignment mark during the processing of a semiconductor wafer into integrated circuits or devices. The present invention is most useful for those processes used to form advanced multilevel ultra-large scale integrated (ULSI) circuits where global planarization techniques, such as chemical-mechanical polishing, are utilized. The present invention is illustrated with respect to a specific exemplary single poly, double metal semiconductor process. The present invention, however, is not intended to be limited to the specific example, process, or materials described herein and is applicable to all processes used to form modern high density, multilevel integrated circuits irrespective of the number of layers formed or materials used. Additionally, in the present invention a substrate, is a semiconductor substrate or wafer or portion thereof, such as, but not limited to, silicon and gallium arsenide, and is the material on which the described process act and layers formed.

Figures 1, 1A, 2:
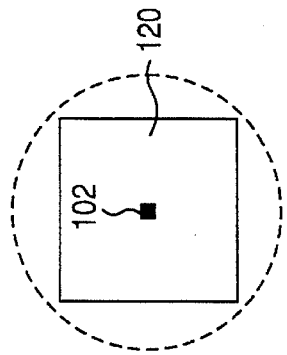
FIGS. 1a–1 and 1a–2 are illustrations of an overhead view of a semiconductor wafer.
Figures 1, 1A:
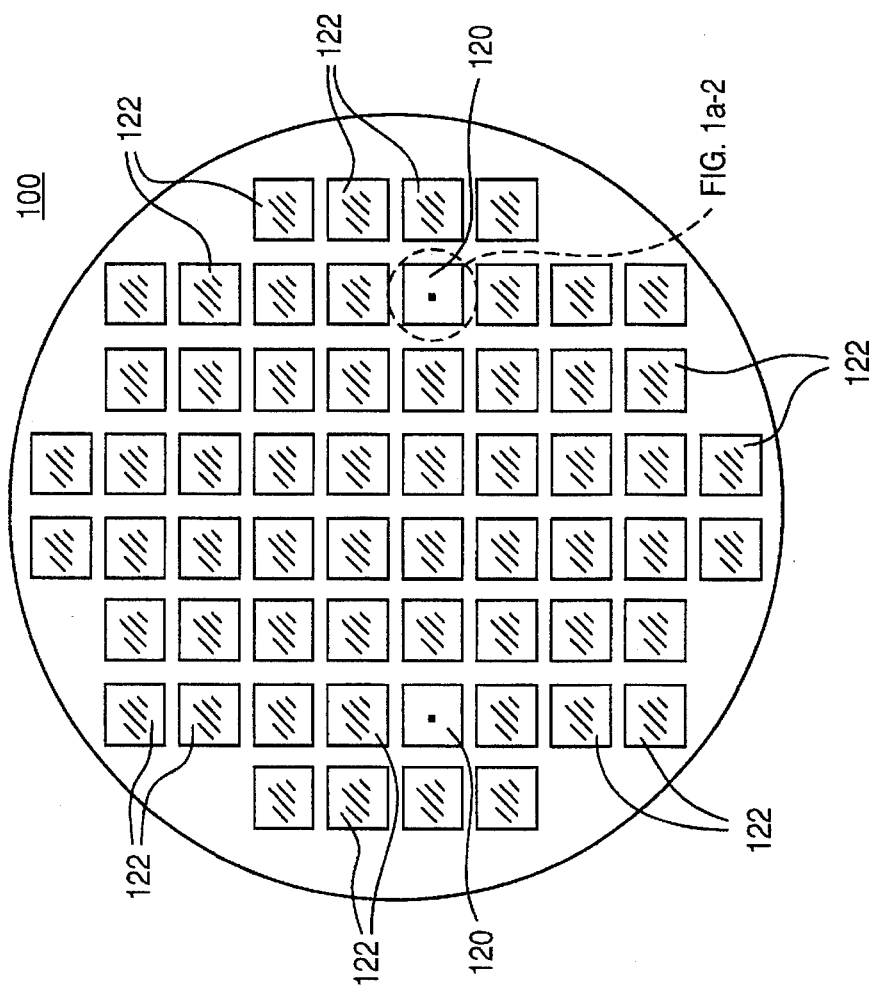
Figure 1B:
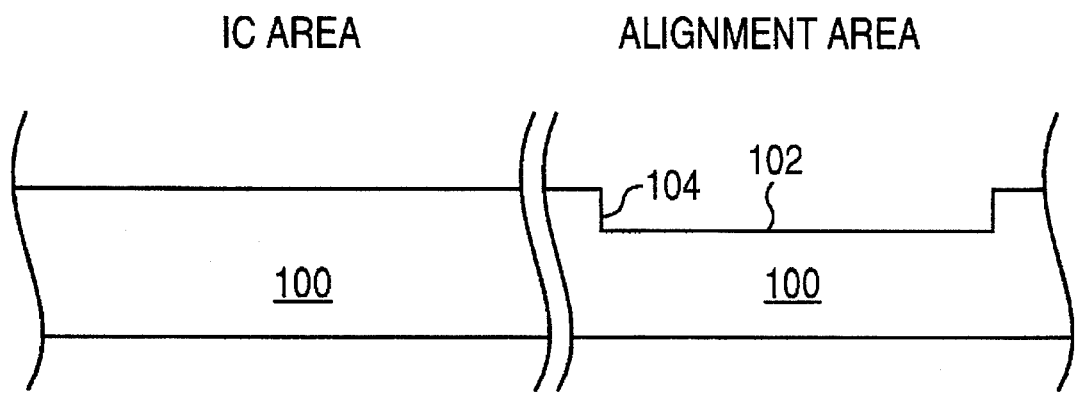
FIG. 1b is an illustration of a cross-sectional view showing the formation of an alignment mark in a semiconductor substrate.
Figure 1C:
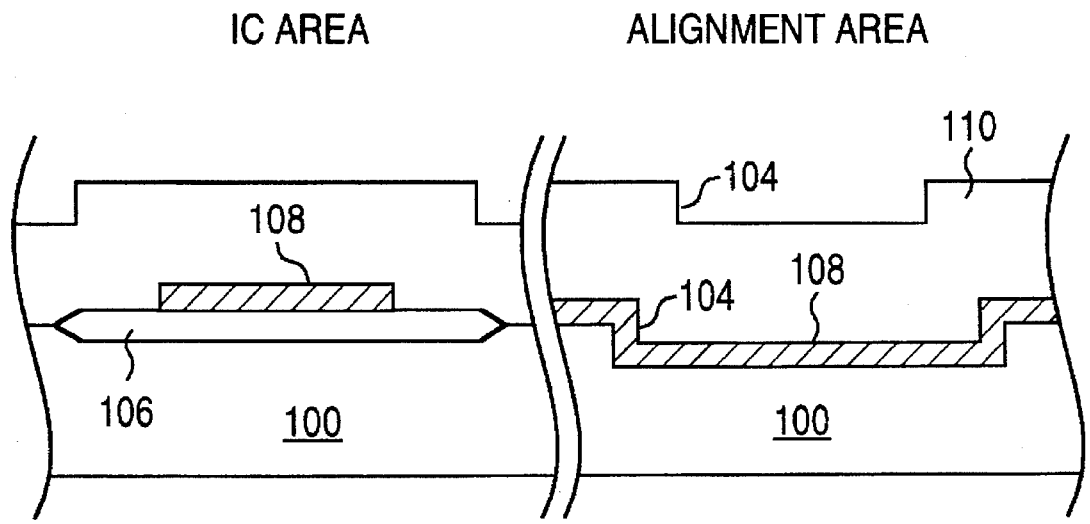
FIG. 1c is an illustration of a cross-sectional view showing the formation of subsequent layers of a semiconductor device on the substrate of FIG. 1b.
Figure 1D:
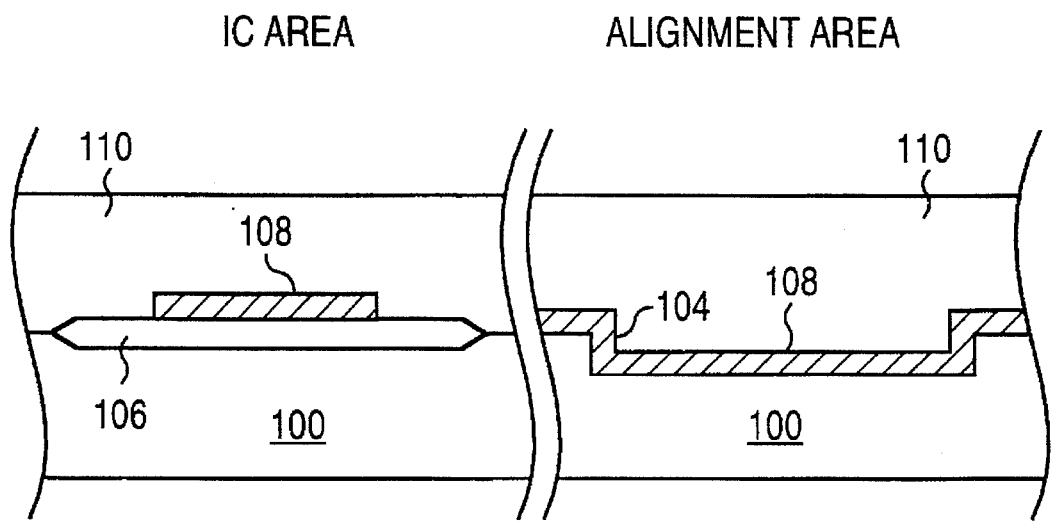
FIG. 1d is an illustration of a cross-sectional view showing a global planarization of the substrate of FIG. 1c.
Figure 1E:
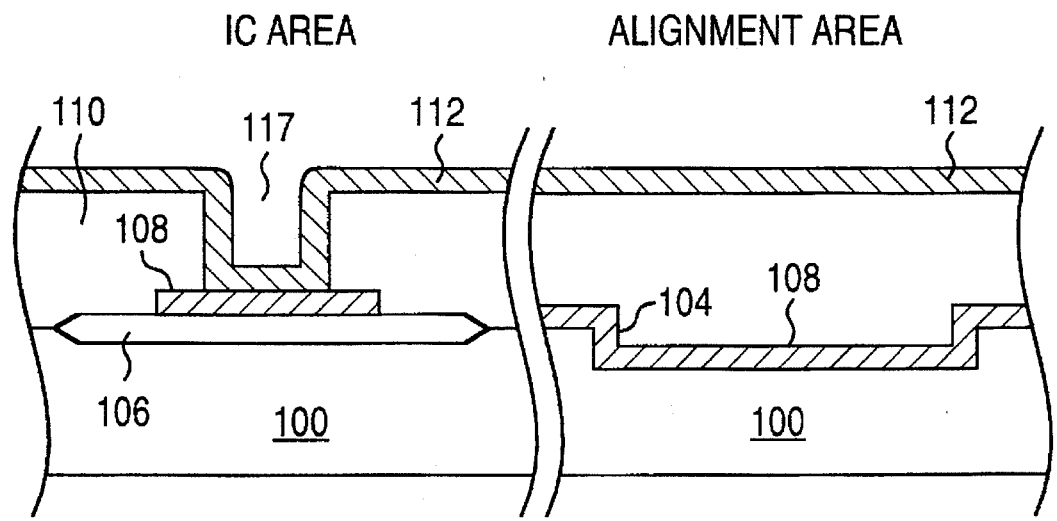
FIG. 1e is an illustration of a cross-sectional view showing the formation of a via hole and an opaque layer on the substrate of FIG. 1d.
Figure 1F:
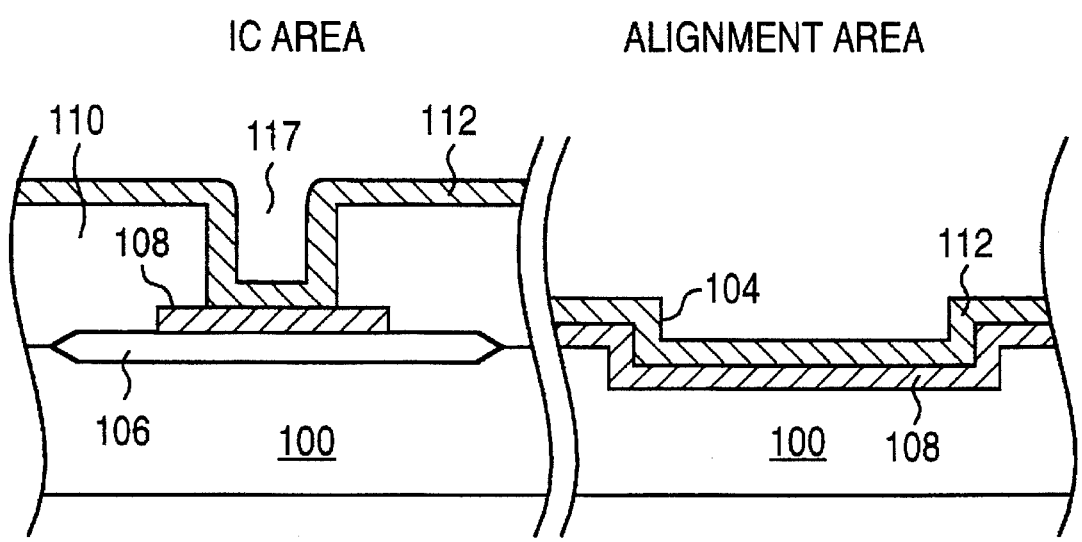
FIG. 1f is an illustration of a cross-sectional view showing the formation of openings and an opaque layer on the substrate of FIG. 1d.

FIG. 2a is an overhead illustration of a processed semiconductor substrate or wafer 300 of the present invention. Substrate 300 has a plurality of devices or integrated circuits 202 and 203, formed thereon. The integrated circuits 202 and 203 are formed on IC areas 302 of substrate 300. Each IC die 202 and 203 lies in a stepping field of a stepper such as ASM 2500/40 by ASM Lithography, which generates the patterns on the wafer used to form the IC layers. Substrate 300 also has at least one, and typically two, blank stepping fields 304. A blank stepping field 304 is an area on substrate 300 which is skipped when the stepper forms patterns over the IC areas of substrate 300. There are typically a plurality of IC die 203 which surround each blank stepping field 304.

Formed in each blank stepping field 304, as shown in FIG. 2b, is a small rectangular alignment mark 310. Alignment mark 310 is surrounded by and is directly adjacent to a slightly larger alignment mark area or an open frame area 308. A drop out area 306 of blank stepping field 304 surrounds and is directly adjacent to alignment mark area 308. No semiconductor devices or circuits are formed in drop out area 306. It is to be appreciated that alignment mark area 308 is significantly smaller than dropout area 306.

Figure 3A:
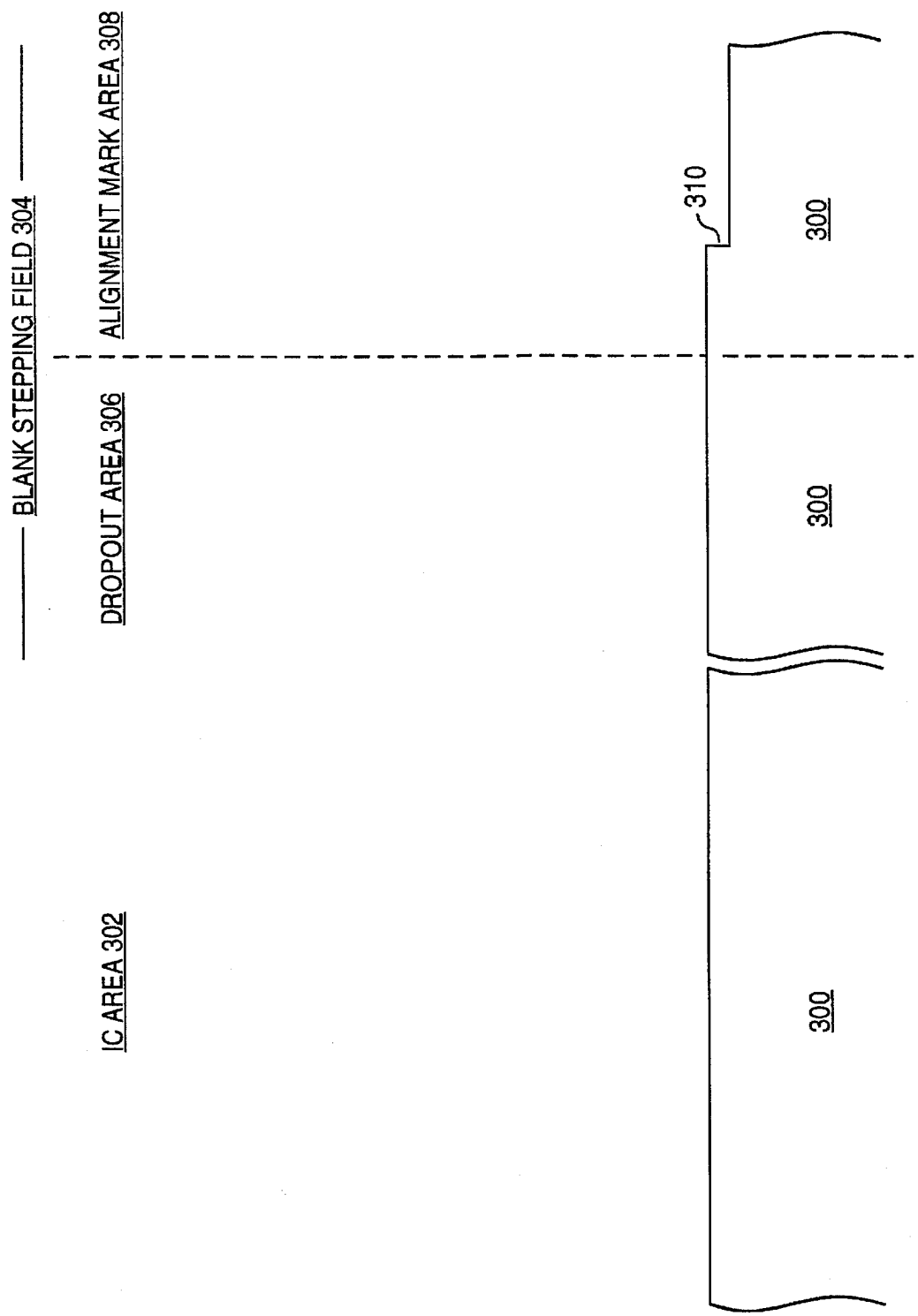
FIG. 3a is an illustration of a cross-sectional view showing the formation of an alignment mark in a semiconductor substrate.

FIG. 3a is a cross-sectional view of a raw substrate 300 showing portions of IC area 302, drop out area 306, and alignment mark area 308. The transition between drop out area 306, and alignment mark area 308 (expressed as a dotted line) is not intended to be an accurate representation of the exact transition. Such transition does not effect the scope or understanding of the present invention. It will be evident from the detailed description that according to the present invention, all layers, in which alignment mark 310 is replicated, are built up in alignment mark area 308 and are removed from dropout area 306. Additionally, globally planarized dielectric layers which do not replicate alignment mark 310 are formed in blank stepping field 306, and are removed from alignment mark area 308. In this way, processes which utilize the present invention are compatible with global planarization techniques, such as chemical-mechanical polishing.

One of the first steps in fabricating a semiconductor device is to form alignment mark 310 in alignment mark area 308. Alignment mark 310 comprises a fixed step height etched into substrate 300. The step height of alignment mark 310 is chosen to be approximately ¼ (or a multiple thereof) of the wavelength of the light used by the stepper or photolithography machine used to align a reticle to substrate 300. The step height of alignment mark 310 is chosen so that the signal to noise ratio of light defraction is optimized, resulting in an optimum alignment precision. Alignment mark 310 is preferably formed by masking and etching substrate 300 to a controlled depth. It is to be appreciated that other well-known techniques may be utilized to form alignment mark 310, such as, but not limited to, etching a film of a controlled thickness and stopping on the underlying layer, or etching a film which masks the growth of a subsequent layer.

Figure 3B:
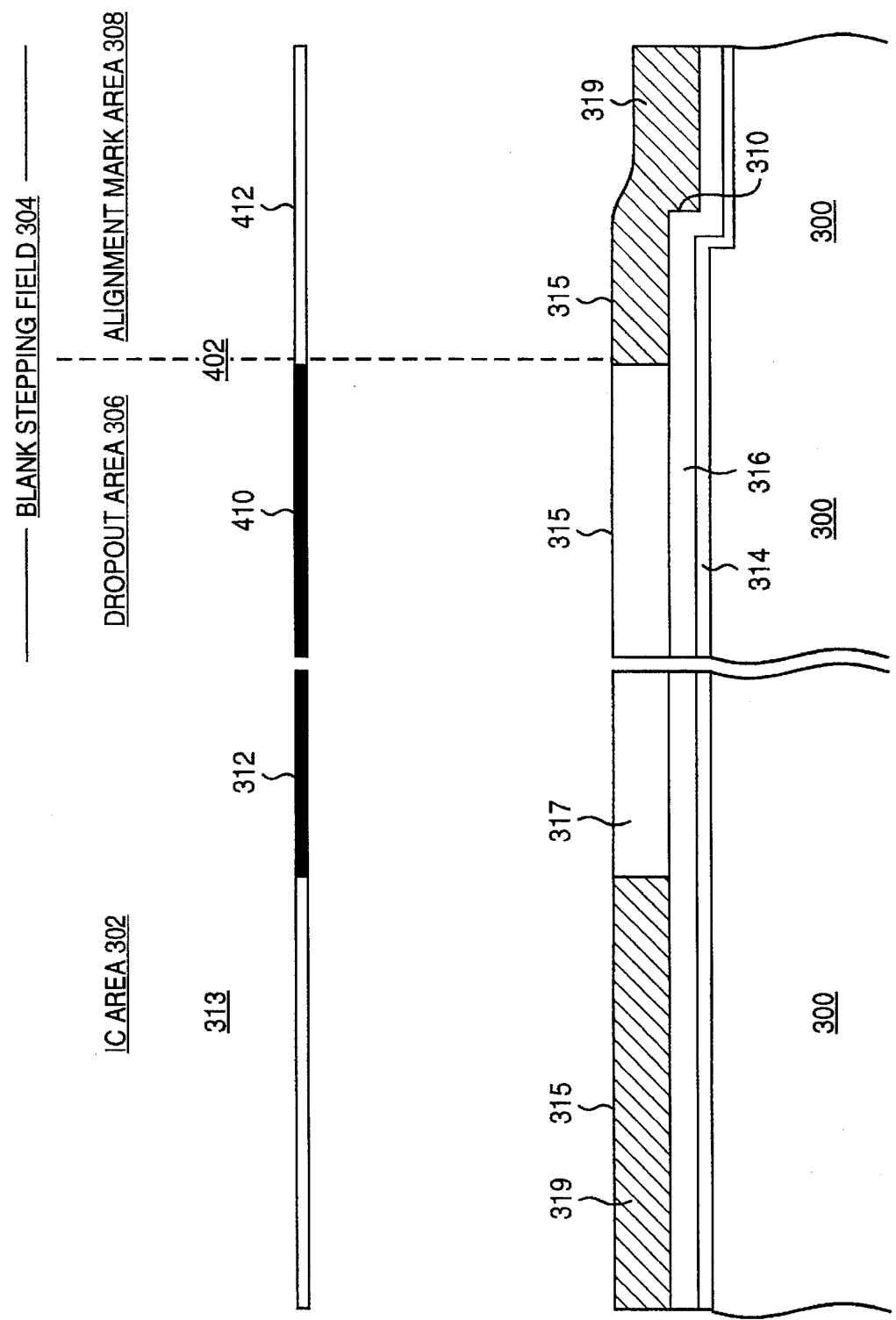

The next step in the fabrication of a multilayer integrated circuit typically is the formation of field isolation regions used to electrically isolate various components formed in IC area 302. As shown in FIG. 3b, a pad oxide layer 314 and a silicon nitride layer 316 are formed over the entire substrate 300. A photoresist layer 315 is then formed over nitride layer 316. Next, the photoresist layer 315 over IC area 302 of substrate 300 is masked, utilizing an IC reticle 313 which contains a chrome pattern defining the locations of IC area 302 where field oxide regions are not to be formed. Field oxide reticle 313 prevents light from exposing a portion 317 of photoresist layer 315 and allows exposure of portion 319 of photoresist layer 315. Field oxide reticle 313 is aligned using alignment mark 310, replicated in nitride layer 316.

Figure 4A:
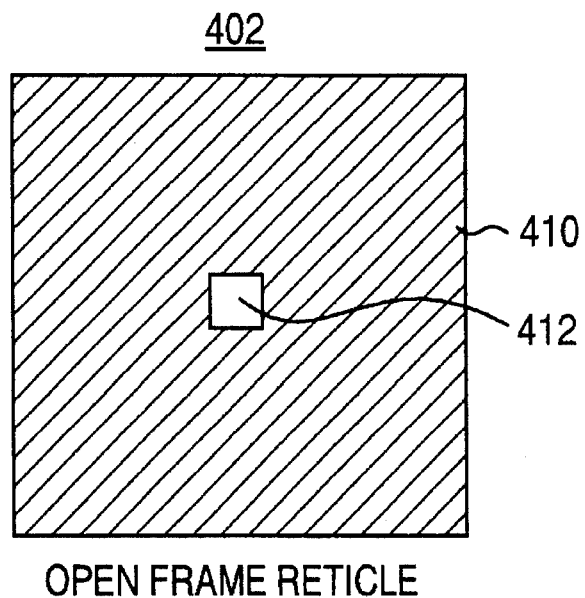
FIG. 4a is an illustration of an open frame reticle.

According to the present invention, after alignment of the field oxide reticle 313, the field oxide reticle is removed and replaced with an open frame reticle 402, as shown in FIG. 3b. Open frame reticle 402 is used to pattern photoresist layer 315 formed over blank stepping field 304. Open frame reticle 402, shown in FIG. 4a, is made of glass (or some other material transparent to light). Open frame reticule 402 has a chrome (or other opaque material) blocking pattern 410 formed around and adjacent to an open or clear window 412. Open window 412 is of sufficient size and shape to expose alignment mark area 308 and alignment mark 310 to light during photoresist exposures. The result, as shown in FIG. 3b, is to expose the portion 319 of photoresist layer 315 over the alignment mark area 308 and to prevent exposure of photoresist layer 315 over dropout area 306. It is to be appreciated that open frame reticle 402 is inexpensive to manufacture and the additional time required for alignment of blank stepping field 304 adds little time to the process. Thus, the cost of the additional step required to align blank stepping field 304 is insignificant, especially as compared to the benefits obtained.

After the alignment and exposure of field oxide reticle 313 and open frame reticle 402, photoresist layer 315 is developed so that those areas 319 exposed to light (i.e., not shielded by chrome) are removed to reveal nitride layer 316 below. Next, the revealed portions of nitride layer 316 and pad oxide layer 314 are etched away using standard techniques.

After photoresist layer 315 is removed by conventional techniques, field oxide 318 is grown with well-known techniques, as shown in FIG. 3c. Field oxide 318 grows only on those areas of substrate 300 which are not covered by pad oxide layer 314 and nitride 316. Thus, field oxide 312 is grown over alignment mark area 308 and alignment mark 310. Field oxide is not grown in dropout area 306. It is to be noted that in accordance with the present invention alignment mark 310 has been replicated in field oxide 318. That is, the step height of alignment mark 310 is substantially built up with and preserved in field oxide layer 318. After field oxide growth, the remaining portions of nitride layer 316 and pad oxide layer 314 are removed.

Figure 3D:
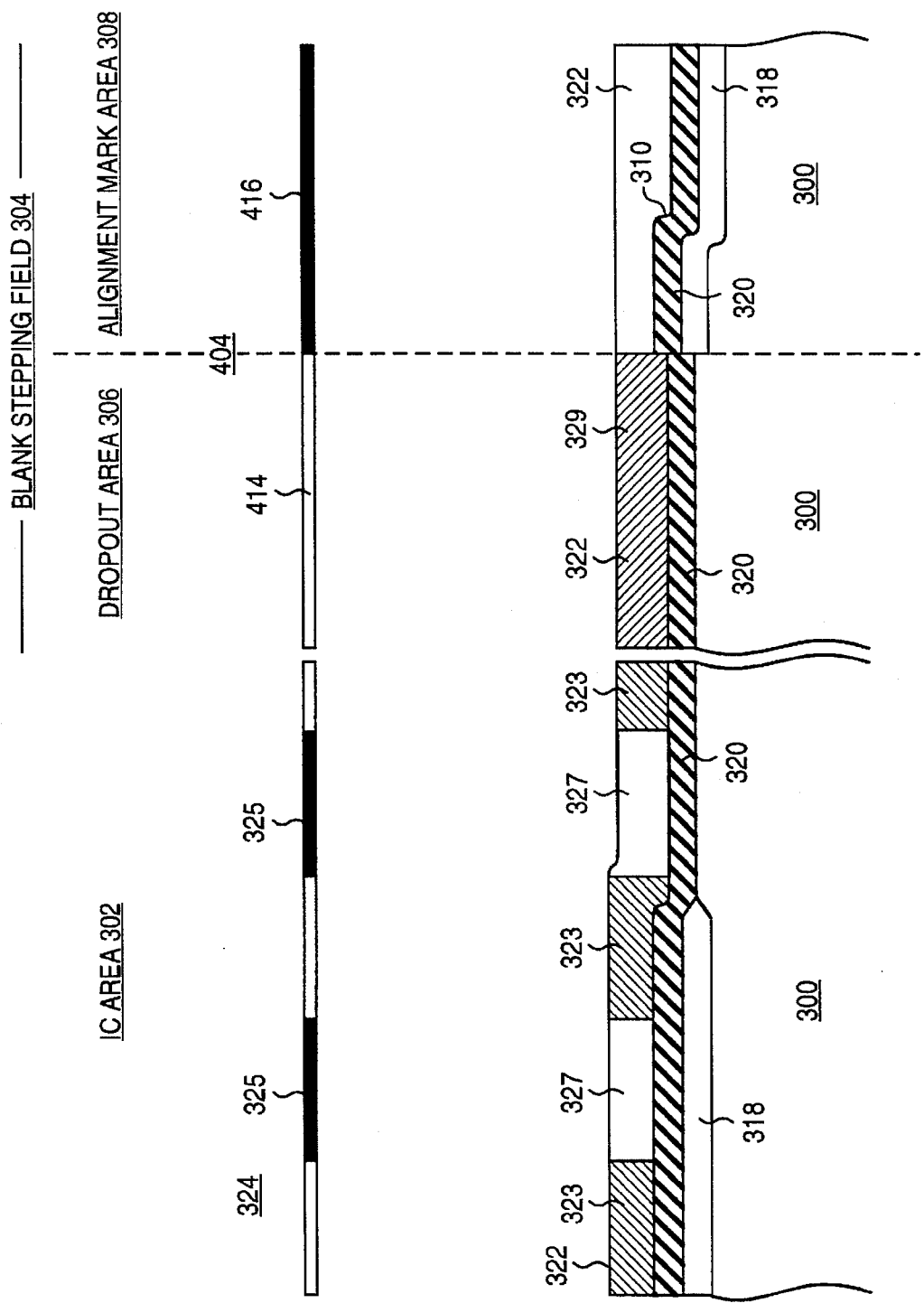
FIG. 3d is an illustration of a cross-sectional view showing the formation of a polysilicon layer and a photoresist on the substrate of FIG. 3c.

The next step in the formation of a multilayer IC, typically, is the growth of a thin gate oxide of about 200 Å (not shown). After gate oxide, a polysilicon layer 320 is formed over the entire surface of substrate 300, as shown in FIG. 3d. A photoresist layer 322 is then formed over polysilicon layer 320. A poly reticle 324 is then aligned over IC area 302 by aligning to alignment mark 310 replicated in polysilicon layer 320. After alignment, photoresist layer 322 over IC area 302 is exposed to light. Those portions 327 of photoresist layer 322 covered by blocking patterns 325 of poly reticle 324 are not exposed to light, while those portions 323 not covered are exposed to light.

Figure 4B:
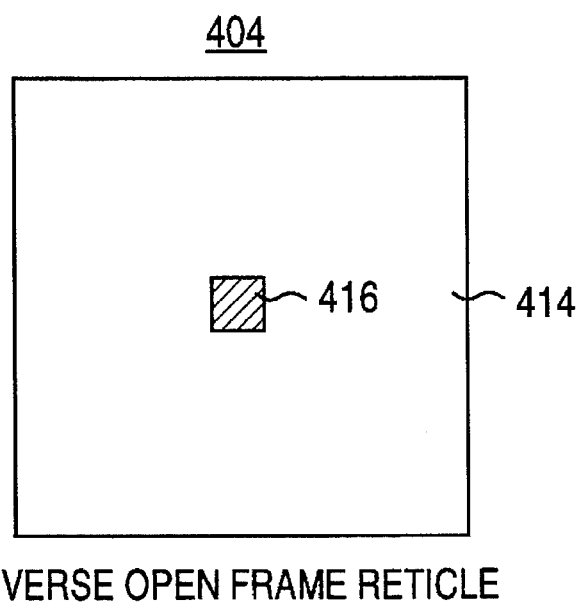
FIG. 4b is an illustration of an inverse open frame reticle.

Next, according to the present invention, poly reticle 324 is removed from the stepper or alignment tool and replaced with an inverse open frame reticle 404. Inverse open frame reticle 404, shown in FIG. 4b, is used to mask blank stepping field 304. Inverse open frame reticle 404 is formed of glass or similar material which is transparent to light. A chrome blocking pattern 416 (or other opaque material) is formed at the center of inverse open frame reticle 404 and is of sufficient size to mask from exposure alignment mark area 308. Adjacent to and surrounding blocking pattern 416, is clear glass or similar material which allows transmission of light and exposure of the entire dropout area 306.

After alignment of inverse open frame reticle 404 over blank stepping field 304, inverse open frame reticle 404 is exposed to light and those portions of photoresist layer 322 over blank stepping field 304, not masked by chrome of inverse open frame reticle 306, are exposed to light (i.e., the portion 329 of photoresist layer 322 over dropout area 306). Next, photoresist layer 322 is developed and portions exposed to light are developed away to reveal respective portions of underlying polysilicon layer 320. Next, polysilicon layer 320 is etched with well-known techniques to remove those portions of polysilicon layer 322 not protected by photoresist. As a result of the etch and according to the present invention, polysilicon layer 320 is removed from dropout area 306 and is left over alignment mark area 308.

Figure 3E:
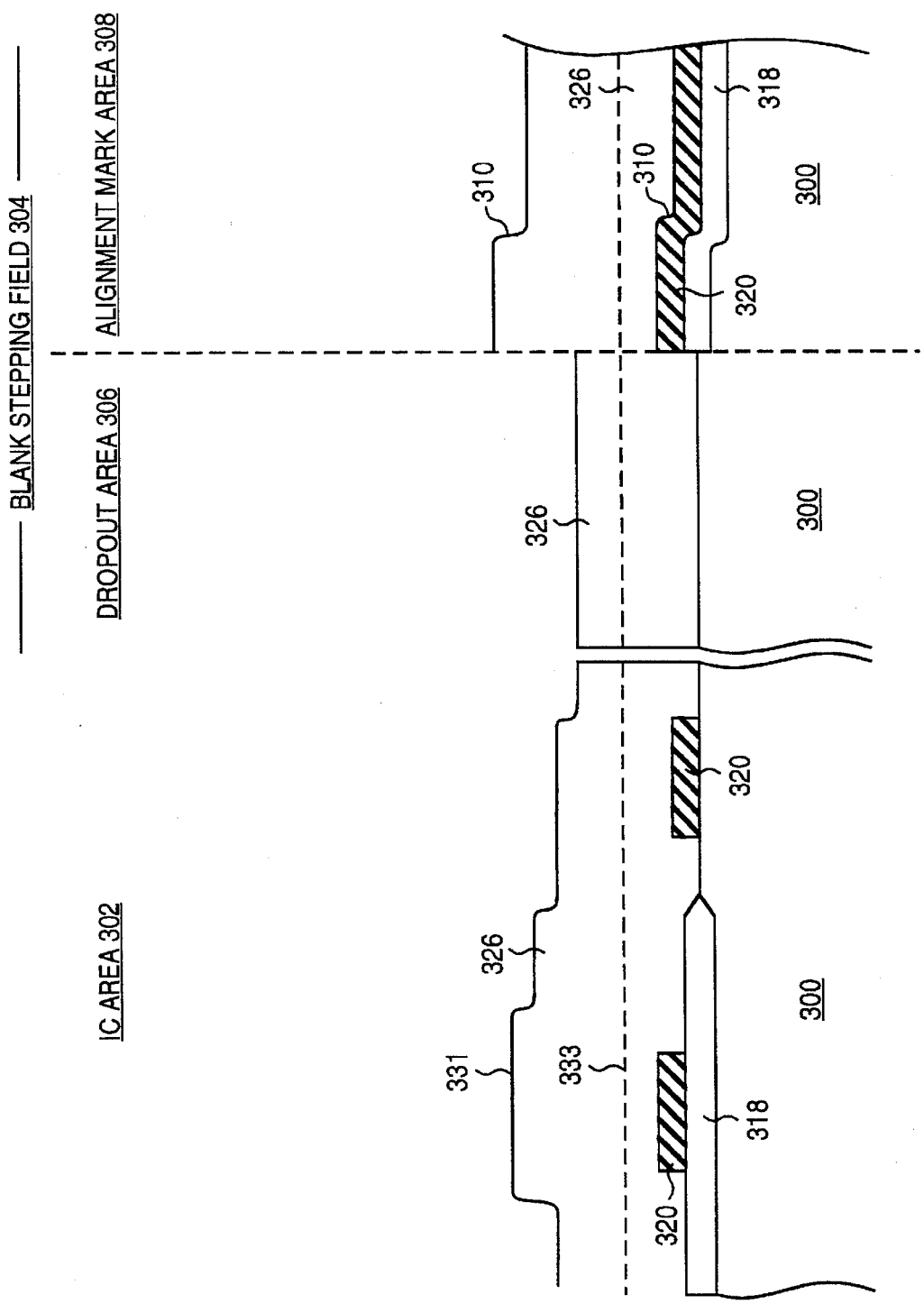
FIG. 3e is an illustration of a cross-sectional view showing the formation of a poly/metal dielectric on the substrate of FIG. 3d.

Generally, the next step, as shown in FIG. 3e, in the formation of a multilevel integrated circuit is the formation of a poly/metal dielectric (PMD) layer 326, such as borophosilicateglass (BPSG), over substrate 300. After deposition of PMD layer 326, alignment mark 310 is replicated in the topography of PMD 326. Next, according to the present invention, in order to improve the topography, PMD layer 326 is globally planarized by well-known techniques. Preferably, PMD layer 326 is planarized using well-known chemical-mechanical polishing (CMP) techniques. The CMP process smoothes PMD layer 326 by abrasively polishing off several thousand angstroms of material until top surface 331 of PMD 326 is made sufficiently planar or flat 333. Well-known polishing equipment, such as a Westech polisher, can be used in the present invention. It is to be noted that alignment mark 310 in PMD 326 is removed or polished off during the planarization process. It is also to be appreciated that because, according to the present invention, only PMD layer 326 has been formed over dropout area 306, the height of dropout area 306 is significantly less than other areas of substrate 300. The chemical-mechanical polishing process, therefore, does not suffer from *high mesa* effects in the present invention.

It is to be appreciated that other planarization techniques, such as plasma etchback or the use of a spin-on-glass (SOG) layer are generally not as desirable because they typically only smooth local steps and do not substantially flatten layers as do CMP processes. Other planarization processes, however, can degrade the quality of alignment mark 310. In these processes alignment mark 310 may still need to be recovered as explained below.

Figure 3F:
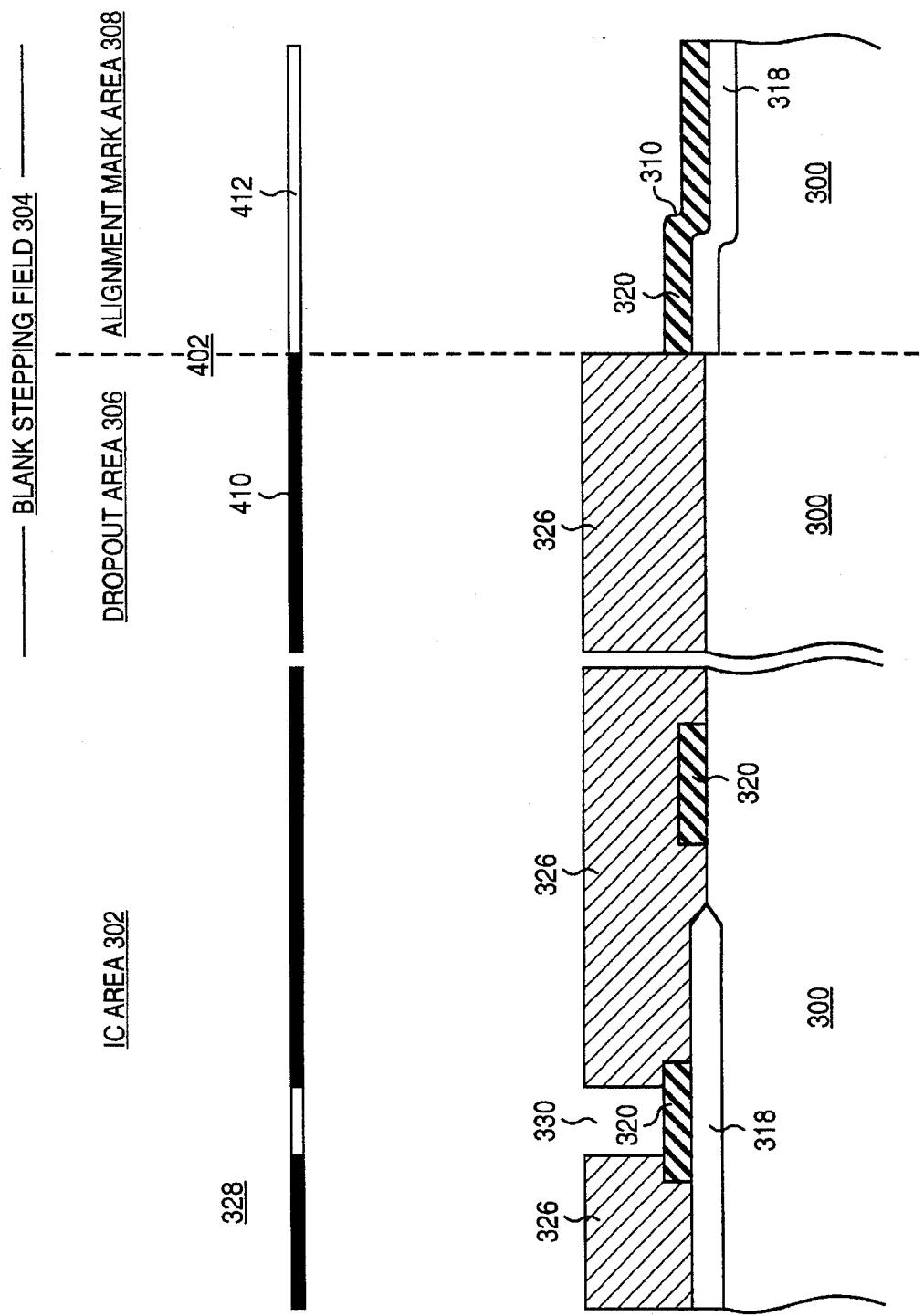
FIG. 3f is an illustration of a cross-sectional view showing the formation of contact opening on the substrate of FIG. 3e.

After global planarization of PMD layer 326, the next step generally is to form contact openings 330 in PMD layer 326 as shown in FIG. 3f. First a photoresist layer (not shown) is formed over substrate 300 and a contact reticle 328 aligned over IC area 302. Although alignment mark 310 has been removed from the top surface of PMD layer 326, alignment mark 310 formed in polysilicon layer 320 is visible through transparent PMD layer 326. Thus, contact reticle 326 can readily be aligned. Contact reticle 328 exposes light to those portions of the photoresist where contacts 330 are to be etched.

According to the present invention, after contact reticle alignment and exposure, blank stepping field 304 is masked using open frame reticle 402. Open frame reticle 402 allows exposure of the photoresist over alignment mark area 308, but prevents exposure of the photoresist over dropout area 306. Like contact reticle 328, open frame reticle 402 is aligned to alignment mark 310 formed in polysilicon layer 320. The photoresist layer is then developed to remove the light exposed portions and leave PMD layer 326 unprotected at contact locations 330 and at alignment mark area 308.

Next, as shown in FIG. 3f, contacts are etched using well-known techniques, such as plasma etching, wet etching, or a combination of wet/dry etching. During contact etch, PMD layer 326 in alignment mark area 308 is also etched away. The contact etch uncovers and recaptures alignment mark 310 formed in polysilicon layer 320. It is to be appreciated that contact 330 and alignment mark area 308 are etched to substantially the same depth. In this way, contact 330 need not be over etched, in order to recapture alignment mark 310. Additionally, since the alignment mark area etch occurs simultaneously with and is to the same depth as the contact etch, it requires no additional time and presents no additional reliability issues.

Figure 3G:
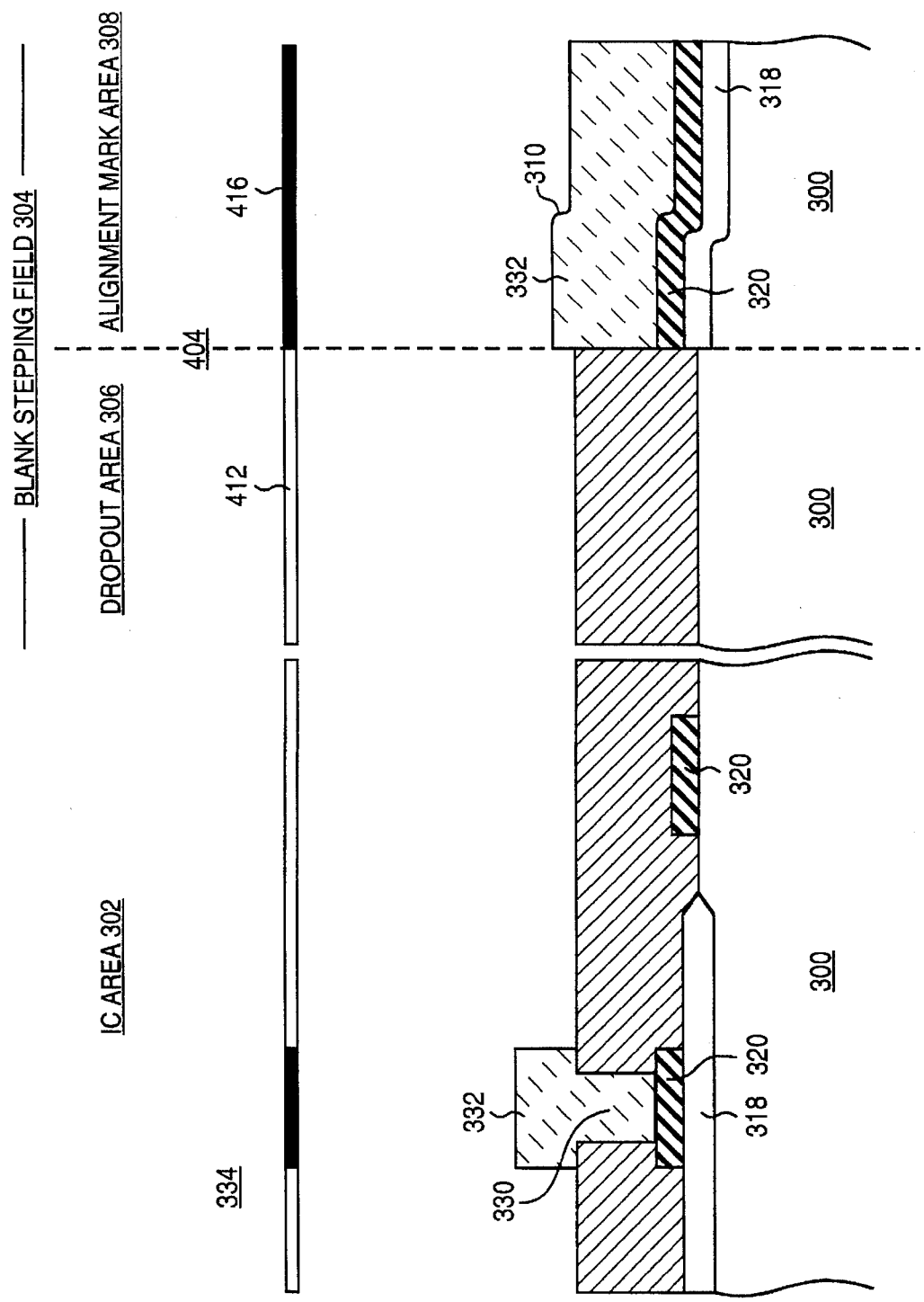
FIG. 3g is an illustration of a cross-sectional view showing the formation of a metal layer on the substrate of FIG. 3f.

The next step in the formation of a multilevel integrated circuit is generally the formation of metal 1 interconnects, as shown in FIG. 3g. To accomplish this, a metal 1 layer 332, such as aluminum, is blanket deposited by sputtering, or other well-known techniques, over the entire substrate 300. Metal 1 layer 332 is formed over PMD 326 and into contact 330 to form an electrical contact with polysilicon layer 320. (It is to be appreciated that well-known metal plugs could be used to fill contacts 330, if desired.) It is to be noted that since alignment mark 310 in polysilicon layer 320 was recaptured, alignment mark 310 is replicated in metal 1 layer 332.

Next, a photoresist layer (not shown) is formed over metal 1 layer 332 and a metal 1 reticle 334 aligned and exposed over IC area 302. Metal 1 reticle 334 is aligned to alignment mark 310 formed in metal layer 332. Next, according to the present invention, inverse open frame reticle 404 is aligned over blank stepping field 304 and exposed. After development of the photoresist layer, light exposed portions are removed and the uncovered portions of metal layer 332 etched away using well-known techniques. The result, as shown in FIG. 3g is the formation of metal 1 interconnects in the IC area 302 of substrate 300. Additionally, according to the present invention, metal layer 332 is removed from dropout area 306 and is left in alignment mark area 308. Metal layer 332 left in alignment mark area 308 replicates alignment mark 310.

After metal 1 interconnect formation, the next step typically is to deposit an interlayer dielectric (ILD) 336, such as $SiO_2$, over the entire surface of substrate 300, as shown in FIG. 3h. It is to be appreciated that the surface topography of ILD 336 over dropout area 306 is well below the highest topography of both IC area 304 and alignment mark area 308.

Next, according to the present invention, ILD 336 is globally planarized with well-known techniques to form a substantially planar surface 341. Preferably, a well-known chemical-mechanical polishing technique is used to remove the step height protrusions from the top surface of ILD 336. Because the ILD topography of dropout area 306 is below most other topographies across the surface of substrate 300, chemical-mechanical polishing does not suffer from "high mesa" effects. IC die 203 surrounding dropout area 306, therefore, polish at rates similar to other IC area locations away from dropout area 306. This creates a uniform polish effect across the entire surface of substrate 300, making the present invention extremely manufacturable.

Figure 3I:
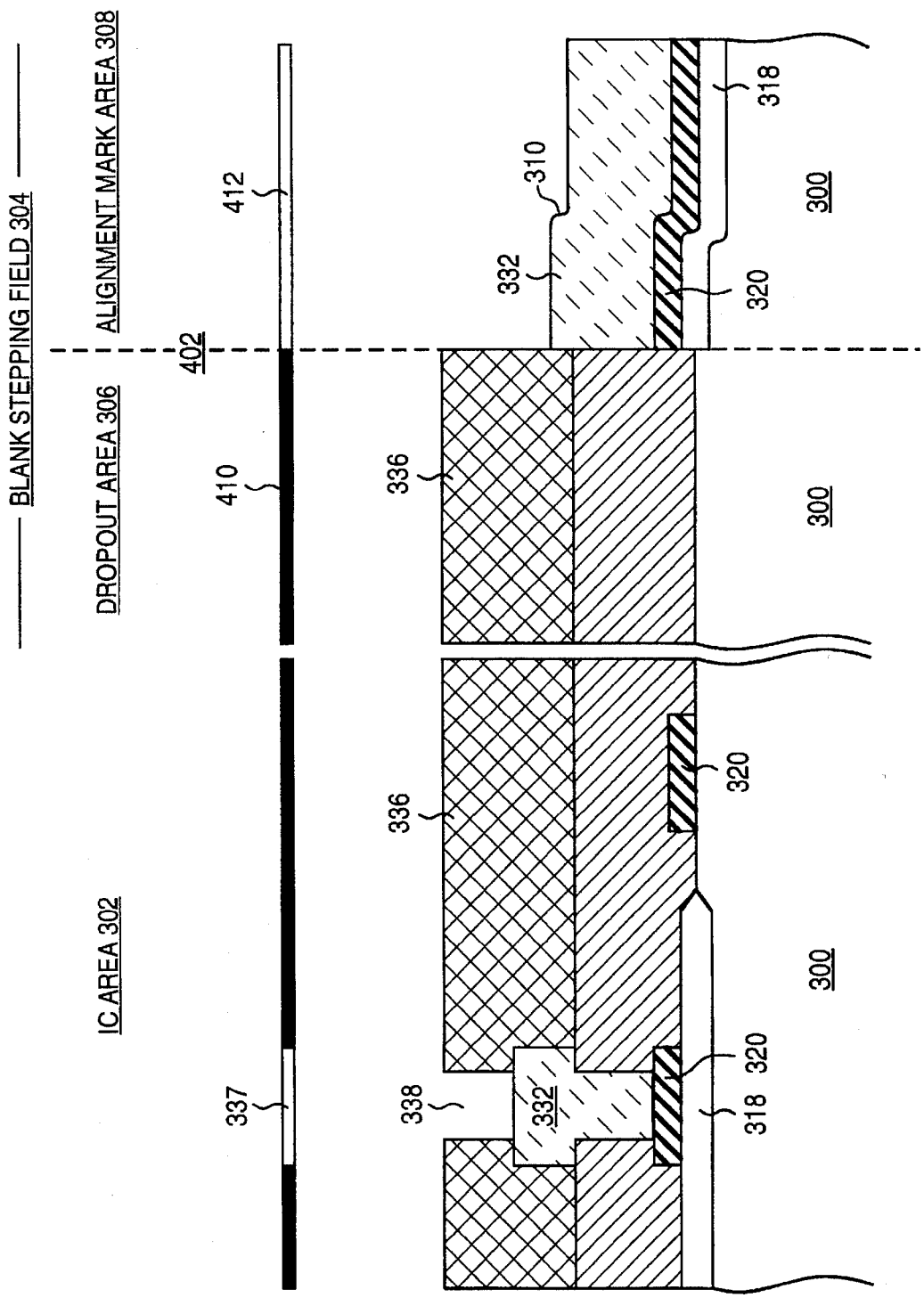
FIG. 3i is an illustration of a cross-sectional view showing the formation of vias on the substrate of FIG. 3h.

After planarization, the next step typically is the formation of via holes, a shown in FIG. 3i. A photoresist layer (not shown) is formed over the entire surface of substrate 300. IC area 302 is then aligned and exposed using a via reticle 337 to define locations where vias 338 will be formed. Next, according to the present invention, open frame reticle 402 is aligned over blank stepping field 304 and exposed. Both via reticle 337 and open frame reticle 402 are aligned to alignment mark 310 in metal layer 332. Although alignment mark 310 has been removed from top surface of ILD 336 alignment mark 310 formed in metal layer 332 is visible through transparent ILD layer 336. The photoresist layer is then developed to remove photoresist from locations where vias are to be etched and from alignment mark area 308. Vias 338 are then etched with well-known processes, such as plasma etching, wet etching, or wet/dry etching. During via etch, ILD 336 over alignment mark area 308 is simultaneously etched to recover and reveal alignment mark 310 formed in metal layer 332. Although alignment mark 310 is slightly deeper than metal 1 in IC area 302, it can still be reached by slightly over etching during via etch. Because alignment mark 310 has been continually built up with all non-planarized layers, there is no need to significantly over etch in order to recover alignment mark 332. This makes the present invention both manufacturable and reliable.

Figure 3J:
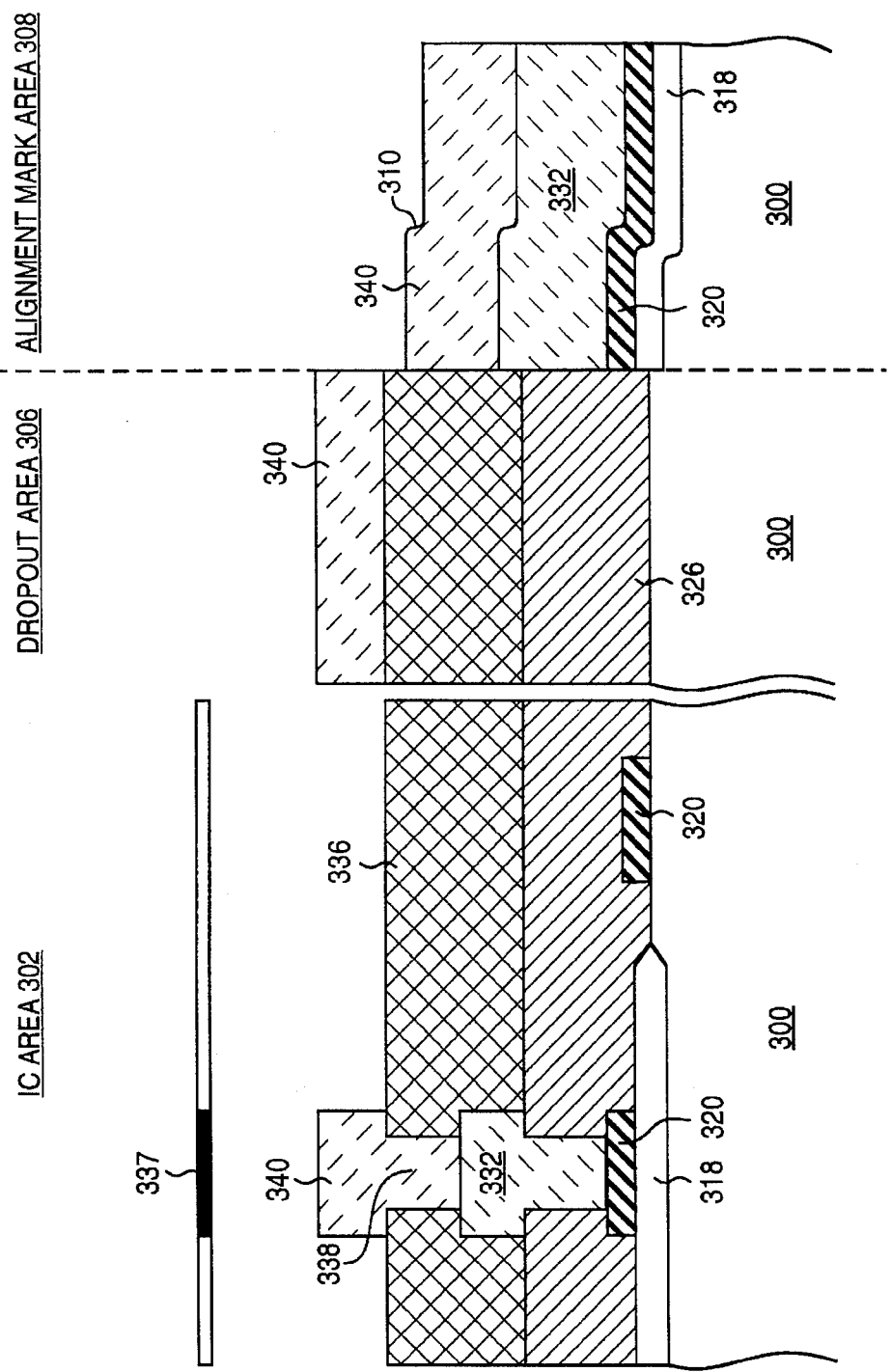
FIG. 3j is an illustration of a cross-sectional view showing the formation of a second metal layer on the substrate of FIG. 3i.

Next, metal 2 interconnects are formed, as shown in FIG. 3j. First, a metal 2 layer 340, such as aluminum, is formed over the entire surface of substrate 300 with well-known techniques. Metal layer 340 forms electrical contacts with metal 1 through vias 338 and replicates alignment mark 310 in alignment mark area 308. After depositing a photoresist layer (not shown) metal 2 reticle is then aligned over IC area 302 using alignment mark 310 formed in metal 2 layer 340. Metal 2 layer 340 is then patterned using the pattern generated from metal 2 reticle. If no additional levels of interconnections are to be generated there is no need to align blank stepping field 304 with inverse open frame reticle 404. The process of the present invention is now complete.

It is important to appreciate what the flow of process steps of the present invention has accomplished. The process of the present invention builds up, in an alignment mark area 308, alignment mark 310, in all layers (i.e., 318, 320, and 332), which substantially replicated the alignment mark. Additionally, these layers 318, 320, and 332, have each been removed from dropout area 306. Globally planarized dielectric layers 326 and 336 have been built up in drop out area 304, but have been removed from alignment mark area 308. By removing layers 318, 320, and 332, from dropout area 306, the surface topography of dropout area 306 is consistently below the topography of other substrate areas during processing. The "low mesa" structure of dropout area 306 prevents high mesa effects and allows uniform polishing of all dies, including those surrounding blank stepping field 304. Additionally, by building up alignment mark 310 in all layers 318, 320, and 332, in which it is substantially replicated (i.e., those layers which are not globally planarized), etching and recovering of alignment mark 310 from globally planarized layer 326 and 336 is possible without significant over etching or creating potential reliability problems.

A novel process for forming an alignment mark in multilayer processes has been described. It is to be appreciated that other processes and materials may be used without departing from the scope of the present invention which is defined by the appended claims which follow. For example, it is expected that one could use a negative resist and opposite polarity reticles than those described herein to obtain the same effect. Additionally, it is expected that one can continue with the flow of process steps of the present invention in order to form still additional layers to the fabricated IC, if desired.

Thus, a process has been described for forming an alignment mark in semiconductor processes which is compatible with global planarization techniques, such as chemical-mechanical polishing.

I claim:

1. An alignment area formed on a semiconductor substrate comprising:

a first area and a second area, said first area comprising an alignment mark having a step height, wherein said second area is adjacent to said first area;

a first layer formed over said first area and over said step height of said alignment mark, wherein said step height of said alignment mark is substantially replicated in said first layer; said first layer not over said second area;

a second layer formed on said first layer and over said first area and over said replicated step height in said first layer, wherein said replicated step height in said first layer is substantially replicated in said second layer, said second layer not over said second area;

a substantially planar third layer over said second area and not over said first area; and wherein said first layer is a field oxide layer, wherein said second layer is a polysilicon layer, and wherein said substantially planar third layer is a BPSG layer.

2. An alignment area formed on a semiconductor substrate comprising:

a first area and a second area, said first area comprising an alignment mark having a step height, wherein said second area is adjacent to said first area;

a first layer formed over said first area and over said step height of said alignment mark, wherein said step height of said alignment mark is substantially replicated in said first layer; said first layer not over said second area;

a second layer formed on said first layer and over said first area and over said replicated step height in said first layer, wherein said replicated step height in said first layer is substantially replicated in said second layer, said second layer not over said second area;

a substantially planar third layer over said second area and not over said first area;

a fourth layer over said first area and above said second layer; said alignment mark substantially replicated in said fourth layer, said fourth layer not formed over said second area.

a substantially planar fifth layer over said second area and above said substantially planar third layer and said planar fifth layer not over said first area; and wherein said fourth layer is a metal comprising aluminum and said substantially planar fifth layer is a silicon dioxide layer.

3. An alignment mark area formed on a semiconductor substrate, said alignment mark area comprising:

a first area and a second area, the second area adjacent to and surrounding said first area;

an alignment mark having a first step height formed in said substrate in said first area;

a field oxide layer formed in said first area over said step height of said alignment mark such that said step height is replicated in said field oxide layer, said field oxide layer not in said second area;

a polysilicon layer formed in said first area over said replicated step height in said field oxide layer such that said replicated step height in said field oxide layer is replicated in said polysilicon layer, said polysilicon layer not in said second area; and a first planarized dielectric layer formed over said substrate in said second area and not in said first area.

4. The structure of claim 3 further comprising a first metal layer formed in said first area and over said replicated step height in said polysilicon layer such that replicated step height in said polysilicon layer is replicated in said first metal layer, said first metal layer not in said second area.

5. The structure of claim 4 wherein said metal layer comprises aluminum.

6. The structure of claim 4 further comprising a second planarized dielectric layer formed over said first planarized dielectric layer in said second area, said second planarized dielectric layer not in said first area.

7. The structure of claim 6 further comprising a second metal layer formed in said first area and over said replicated step height in said first metal layer such that said replicated step height in said first metal layer is replicated in said second metal layer.

* * * * *